(12) United States Patent
Talwalkar et al.

(10) Patent No.: US 7,236,044 B2
(45) Date of Patent: Jun. 26, 2007

(54) APPARATUS AND METHOD FOR ADJUSTING THE SUBSTRATE IMPEDANCE OF A MOS TRANSISTOR

(75) Inventors: Niranjan Talwalkar, San Jose, CA (US); Chik P. Yue, Pittsburgh, PA (US); S. Simon Wong, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 94 days.

(21) Appl. No.: 10/965,683

(22) Filed: Oct. 13, 2004

(65) Prior Publication Data

US 2005/0110558 A1 May 26, 2005

Related U.S. Application Data

(60) Provisional application No. 60/510,403, filed on Oct. 14, 2003.

(51) Int. Cl.
*H03K 3/01* (2006.01)
(52) U.S. Cl. .................................................... 327/534
(58) Field of Classification Search ................ 327/534, 327/536, 537
See application file for complete search history.

(56) References Cited

U.S. PATENT DOCUMENTS

| | | | | |
|---|---|---|---|---|
| 6,031,411 | A | 2/2000 | Tsay et al. | 327/536 |
| 6,124,752 | A | 9/2000 | Kuroda | 327/534 |
| 6,177,826 | B1* | 1/2001 | Mashiko et al. | 327/534 |
| 6,177,831 | B1* | 1/2001 | Yoneda et al. | 327/537 |
| 6,229,380 | B1* | 5/2001 | Hedberg | 327/536 |
| 6,341,087 | B1 | 1/2002 | Kunikiyo | 365/189.09 |
| 6,654,305 | B2 | 11/2003 | Tsunoda et al. | 365/226 |
| 6,715,090 | B1 | 3/2004 | Totsuka et al. | 713/323 |
| 2003/0016075 | A1* | 1/2003 | Itoh | 327/534 |
| 2003/0197547 | A1* | 10/2003 | Mizuno et al. | 327/534 |
| 2004/0169547 | A1* | 9/2004 | Jones et al. | 327/536 |

* cited by examiner

*Primary Examiner*—Jeffrey Zweizig
(74) *Attorney, Agent, or Firm*—Lumen Intellectual Property Services

(57) ABSTRACT

Method and apparatus for adjusting an impedance of a substrate of a Metal-Oxide-Semiconductor (MOS) transistor by providing a bias voltage and connecting a frequency-selective circuit between the substrate and the bias voltage. The frequency-selective circuit is also provided with at least one reactive element, such as an inductive element or a capacitive element, to obtain a certain frequency-response of the frequency-selective circuit and thus adjusts the substrate impedance of the MOS transistor. The method and apparatus are compatible with standard CMOS technology and applicable to RF switches, including T/R switches for processing high-frequency analog signals.

19 Claims, 2 Drawing Sheets

APPARATUS AND METHOD FOR ADJUSTING THE SUBSTRATE IMPEDANCE OF A MOS TRANSISTOR

RELATED APPLICATIONS

This application claims priority from the provisional U.S. patent application No. 60/510,403, filed on 14 Oct. 2003 and incorporated as reference herein.

FIELD OF THE INVENTION

The present invention relates to a method and apparatus for improving the performance of a MOS transistor at select frequencies by adjusting the transistor's substrate impedance with an impedance circuit that employs one or more reactive elements such as inductors and capacitors.

BACKGROUND OF THE INVENTION

Metal-Oxide-Semiconductor (MOS) transistors find extensive use in modern integrated circuitry including chips fabricated with the standard Complementary Metal-Oxide-Semiconductor (CMOS) technology. Depending on the operating conditions or modes of the integrated circuit, the substrate on which the transistors reside may require biasing. In those situations, the prior art teaches to apply a stable reference potential also referred to as DC bias to the substrate to control or enhance the operation of the integrated circuit and/or its transistors. In an integrated circuit, the substrate may be divided into regions that are doped differently. Each region is known as a well or tub, and may have one or more transistors. This is to provide electrical isolation between transistors in different wells. Each well of the substrate may be biased to a different potential.

In the simplest case, the prior art teaches to apply a single DC bias or potential to the substrate at all times. In other cases the prior art teaches selection of the DC potential depending on the change in operation modes or other parameters of the integrated circuitry. For example, U.S. Pat. No. 6,031,411 to Tsay et al. teaches a bias circuit to provide a stable substrate reference potential for a variety of operating modes. More specifically, Tsay uses a control circuit to select from among a plurality of substrate bias circuits only one substrate bias circuit to provide the substrate reference potential for a given operation mode. In U.S. Pat. No. 6,654,305 Tsunoda et al. teach to finely control power consumption of an Large Scale Integrated (LSI) system by using substrate-bias generation circuits for supplying substrate biases independent of each other to functional modules integrated in the system. Tsunoda et al. use a substrate-bias control circuit for controlling the substrate-bias generation circuits. In addition, a storage unit is provided for storing control values to be supplied to the substrate-bias generation circuits. In U.S. Pat. No. 6,124,752 Kuroda teaches an integrated circuit that biases the semiconductor substrate to achieve power reduction in a stand-by mode based on threshold values. Still more methods and apparatus for controlling the substrate biases in accordance to operation modes of a processor are taught in U.S. Pat. No. 6,715,090 to Totsuka et al.

The above prior art references teach to apply one DC bias potential at a time to the substrate as a function of various performance parameters including operation mode and power consumption of an entire integrated circuit or of a large portion or module thereof. In U.S. Pat. No. 6,341,087 Kunikiyo teaches a semiconductor device with a body bias generation circuit that supplies a body region of an individual PMOS transistor with a body potential. The body potential is applied so that the body region may be reversely biased or not biased relative to the source region in response to an input signal.

Although the above prior art solutions are useful in many situations, new wireless voice and data communication systems capable of delivering megabits of data at a fast rate pose a new set of challenges. A focus of the integrated circuit industry is now on developing highly-integrated, low-cost and low-power circuits for processing radio-frequency (RF) analog signals at frequencies in excess of 1 GHz. In such circuits, low-noise amplifiers (LNAs) and power amplifiers (PAs) tend to be integrated on the same chip in the standard CMOS technology. To further increase the integration level, transmit-receive (T/R) switches must be integrated as well.

Unfortunately, performance parameters stand in the way of integrating T/R switches in CMOS circuits operating at high frequencies. Specifically, even with prior art substrate biasing solutions, MOS transistors in modern CMOS technology do not exhibit the linearity and loss performance at the desired frequencies to serve in T/R switches. In fact, the use of MOS transistors in CMOS technology for other low-loss and highly linear RF switches, e.g., RF switches for selecting capacitors for tuning frequency selective circuits such as voltage-controlled-oscillators (VCOs), is also compromised. Therefore, in the case of T/R switches for high-speed wireless applications, the prior art teaches the use of discrete components such as GaAs Field-Effect Transistors (MESFETs) and PIN-type diodes.

Another factor limiting the performance of RF integrated circuits is the substrate resistance of the MOS transistor. In common practice, the substrate resistance of a MOS transistor is minimized to prevent latch-up and improve breakdown voltage. This is achieved by surrounding the transistor with substrate contacts and strapping these with a low-resistance metal that is connected to a proper fixed voltage (such as ground). However, in certain RF transceiver blocks, e.g., LNAs, it is desirable to contemporaneously have as large a substrate resistance for the cascade transistor as possible. Of course, maximizing substrate resistance in these blocks compromises the latch-up immunity predicated on minimized substrate resistance. Furthermore, it is often difficult to increase the substrate resistance of a MOS transistor due to technology constraints.

Hence, what is desired is a MOS transistor with substrate impedance that can be adjusted to match the performance requirements.

OBJECTS AND ADVANTAGES

In view of the shortcomings of the prior art, it is a primary object of the present invention to provide an apparatus and method for adjusting the substrate impedance of a MOS transistor. In particular, it is an object of the invention to provide an apparatus and method to adjust the substrate impedance of a MOS transistor in integrated circuits in CMOS technology.

More specifically, it is an object to adjust the substrate impedance as necessary for operating the MOS transistor at high frequencies while exhibiting good performance including high linearity, low-loss, high latch-up immunity and appropriate impedance at desired frequencies.

It is a further object of the invention to ensure improved performance of MOS transistors in various switching applications including, among other, RF switches and T/R switches.

These and numerous other objects and advantages of the present invention will become apparent upon reading the following description.

SUMMARY

In one embodiment the invention comprises a method for adjusting an impedance of a substrate, also referred to as substrate impedance, of a Metal-Oxide-Semiconductor (MOS) transistor. In accordance with the method, a bias voltage is provided and a frequency-selective circuit is connected between the substrate and the bias voltage. The frequency-selective circuit is also provided with at least one reactive element, such as an inductive element or a capacitive element, to obtain a certain frequency-response of the frequency-selective circuit. In this manner, the frequency-response of the frequency-selective circuit adjusts the substrate impedance of the MOS transistor.

The present method of adjusting substrate impedance of MOS transistors is well-suited for processing analog signals at high frequencies. Thus, the method can be used in radio-frequency (RF) switches including transmit-receive (T/R) switches for wireless communication circuits to process high-frequency signals at more than 1 GHz.

The reactive elements used in the frequency-selective circuit can be either inductive elements or capacitive elements and they can be integrated on-chip or positioned off-chip. In some embodiments only one reactive element, e.g., an inductive element is used. The inductive element can, in some cases, be a bond wire. In some embodiments one capacitive and one inductive element are used. More specifically, in some of these embodiments the inductive element and the capacitive element are configured to form an LC-tank with a resonant frequency in an operating range of the MOS transistor.

The bias voltage applied to the frequency-selective circuit can be a fixed at a certain value and it can be supplied by a fixed voltage source. Note that the bias potential or bias voltage can be a ground voltage.

The method of invention can include biasing of the MOS transistor. For example, in some embodiments a gate terminal or gate of the MOS transistor is biased.

The invention further extends to an apparatus for adjusting the impedance of the MOS transistor's substrate. The apparatus has a bias voltage source and a frequency selective circuit connected between the substrate and the bias voltage source. At least one reactive element, such as an inductive or a capacitive element, defines a certain frequency-response of the frequency-selective circuit to thus adjust the impedance of the substrate.

The apparatus of the invention can be used in MOS transistors in standard CMOS circuits. In particular, the present apparatus and method can be applied in RF switches, including T/R switches in integrated CMOS T/R switches operating at above 1 GHz. A detailed description of the invention and the preferred and alternative embodiments is presented below in reference to the attached drawing figures.

DETAILED DESCRIPTION

Figure 1:
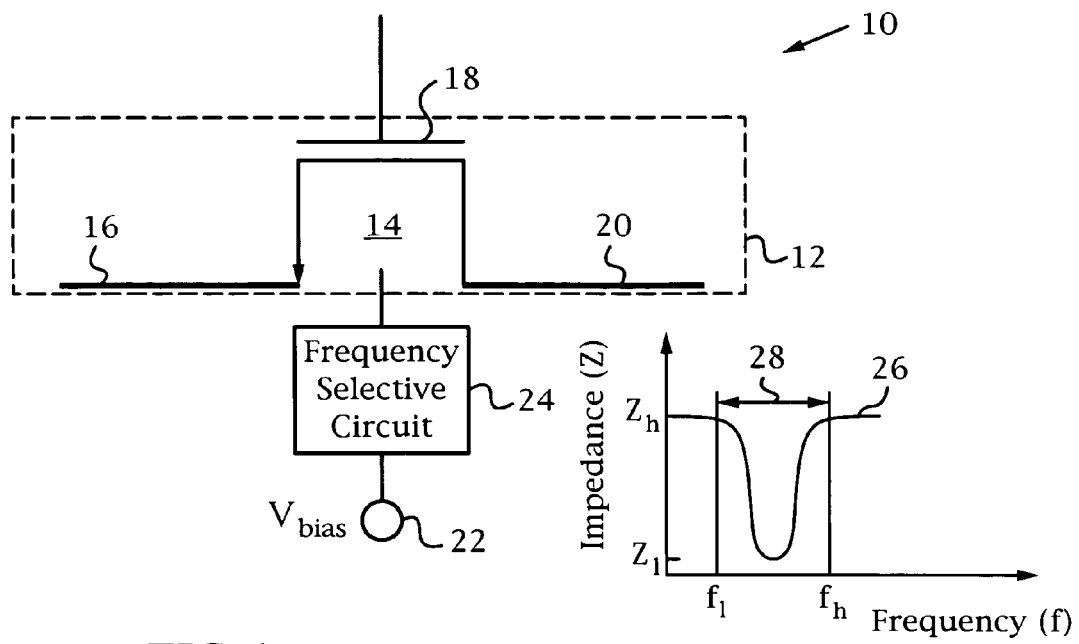
FIG. 1 is a simplified circuit diagram of an apparatus according to the invention with a frequency-selective circuit connected between the substrate and a fixed voltage source for adjusting the impedance of a MOS transistor's substrate.

The invention will be best understood by initially reviewing a simplified diagram of an apparatus 10 according to the invention as shown in FIG. 1. Apparatus 10 is designed for adjusting the impedance of a Metal-Oxide-Semiconductor (MOS) transistor 12 built on a substrate 14. Transistor 12 has a source terminal 16, a gate terminal 18 and a drain terminal 20. It will be appreciated by a person skilled in the art that in an integrated circuit, the substrate may be divided into regions that are doped differently. Each region is known as a well or tub, and may have one or more transistors such as transistor 12. This architecture is designed to provide electrical isolation between transistors in different wells. Each well of the substrate may be biased to a different potential. Therefore, when referring to substrate 14 herein it is to be understood that substrate 14 may represent an entire substrate or just a portion or separate region thereof.

Apparatus 10 has a bias voltage source 22 for providing a bias voltage $V_{bias}$. Bias voltage $V_{bias}$, also known in the art as bias potential or bias voltage potential, can be fixed at a certain value or it can vary. Source 22 can be a fixed source in embodiments where bias voltage $V_{bias}$ is fixed. For example, in the present embodiment source 22 is a ground contact and thus bias voltage $V_{bias}$ is fixed at a ground voltage or ground potential.

A frequency-selective circuit 24 is connected between substrate 14 and bias voltage source 22. Circuit 24 has a certain frequency-selective response over the operating range of transistor 12. In other words, the impedance of circuit 24 varies as a function of frequency. The frequency-selective response of circuit 24 is selected with the aid of at least one reactive element. Reactive elements include inductive elements having certain inductances L or capacitive elements having certain capacitances C. A skilled artisan will appreciate that many ways of connecting inductive and capacitive elements in LC configurations including serial and parallel are known in the art. Furthermore, appropriate selection of the configuration and the inductance L and capacitance C values is used to produce a desired frequency-selective response.

The frequency-selective response of circuit 24 in the present embodiment is indicated by response graph 26. Specifically, response graph 26 plots impedance Z of circuit 24 as a function of frequency f. In an operating range 28 extending from a low frequency $f_l$, to a high frequency $f_h$, the impedance Z of circuit 24 has a low value $Z_l$, while outside operating range 28 it has a high value $Z_h$. Consequently, circuit 24 adjusts the impedance of substrate 14 of transistor 12, or substrate impedance, to $Z_l$, within operating range 28 and to $Z_h$ outside operating range 28. A person skilled in the art will recognize that response graph 26 is merely exemplary and that a number of operating ranges with different values of impedance Z (and different shapes of response graph 26) are possible.

The present method of adjusting substrate impedance of transistor 12 is well-suited for processing analog signals at high frequencies. Thus, the method of invention and apparatus 10 can be used in radio-frequency (RF) switches including transmit-receive (T/R) switches for wireless communication circuits to process high-frequency signals at more than 1 GHz.

Figure 2:
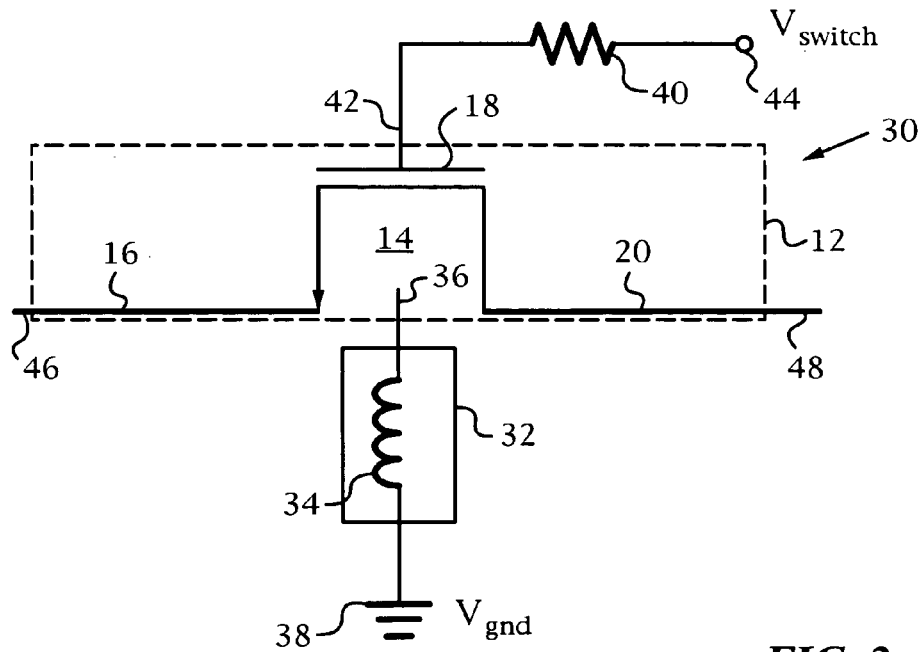
FIG. 2 is a simplified circuit diagram of another embodiment of the apparatus employing an inductive element.

In another apparatus 30 according to the invention, transistor 12 is connected as shown in FIG. 2. In this embodiment transistor 12 is an n-type MOS transistor. A frequency-selective circuit 32 uses an inductive element or inductor 34 having an inductance L as the sole reactive element to connect a substrate terminal 36 to a bias voltage source 38. In the present case bias voltage source 38 is ground and thus the bias voltage is the fixed ground voltage or $V_{gnd}$.

A resistor 40 is used to bias a gate terminal 42 of transistor 12 to a control or switch voltage 44. Control voltage 44 is used for turning transistor 12 on and off. Apparatus 30 can be employed in a T/R switch at radio-frequencies (RF), to achieve high linearity from a source terminal 46 to a drain terminal 48 of MOS transistor 12. The value of inductance L of inductor 34 is chosen to exhibit a low value at direct current (dc) and low frequencies to enhance latch-up immunity. Inductor 34 behaves as a high-impedance to any high-frequency signal applied as input to transistor 12. Substrate terminal 36 is thus bootstrapped by source or drain terminal 46 or 48 of MOS transistor 12. Gate terminal 42 is also bootstrapped at high frequencies due to resistor 40, thereby resulting in a 'floating' MOS transistor 12 whose gate-source, gate-drain, source-substrate, and drain-substrate voltage amplitudes are relatively small despite a large input voltage amplitudes at source or drain terminals 46, 48. In other words, the method of invention includes biasing of MOS transistor 12. In this embodiment gate terminal 42 and thereby gate 18 of MOS transistor 12 is biased. The bias potential is selected to turn on or off transistor 12.

Figure 3:
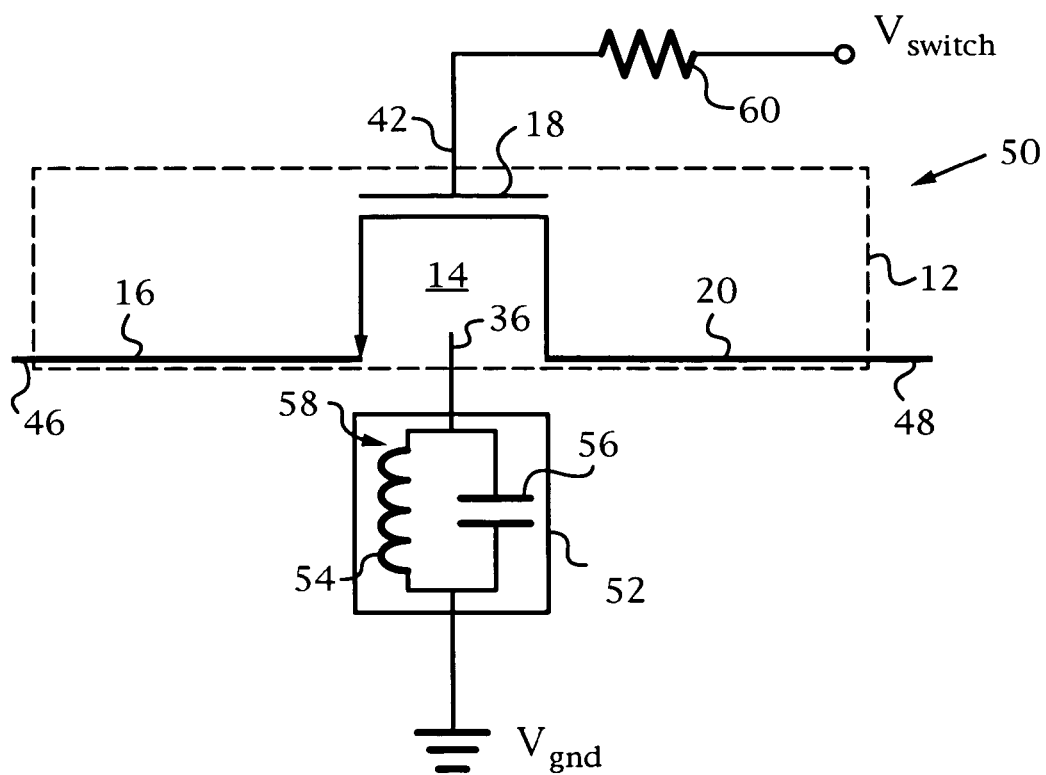
FIG. 3 is a simplified circuit diagram of yet another embodiment of the apparatus employing an LC-tank having an inductive element and a capacitive element.

In another exemplary embodiment shown in FIG. 3, an apparatus 50 for adjusting the substrate impedance of transistor 12 has a frequency-selective circuit 52 that uses one inductive element 54 and one capacitive element 56. More specifically, inductive element 54 and capacitive element 56 are configured to form an LC-tank 58 with a resonant frequency in an operating range of MOS transistor 12. In other words, inductor 54 and capacitor 56 are connected in parallel to bias substrate terminal 36 of n-type MOS transistor 12 to a ground voltage $V_{gnd}$.

A resistor 60 is used to bias gate terminal 42 of MOS transistor 12 to a control or switch voltage $V_{switch}$ that turns transistor 12 on and off. This embodiment permits transistor 12 to be used in a T/R type switch at RF, to achieve high linearity from the source terminal 46 to drain terminal 48. The inductance L and capacitance C values of inductor 54 and capacitor 56 are chosen so that parallel LC-tank 58 resonates at the input signal frequency of the T/R switch. The parallel resonance creates a very high-impedance at the resonance frequency at substrate terminal 36. Substrate terminal 36 is thus bootstrapped by source or drain terminal, 46 or 48, of MOS transistor 12. Gate terminal 42 is also bootstrapped at the frequency of operation due to resistor 60, thereby resulting in a 'floating' MOS transistor whose gate-source, gate-drain, source-substrate, and drain-substrate voltage amplitudes are relatively small despite a large input signal amplitude at source or drain terminal, 46 or 48, of MOS transistor 12. LC-tank 58 behaves as a low-impedance at low frequencies and hence does not compromise the latch-up immunity. A person skilled in the art will recognize many advantageous implementations of this technique, for example as described in Niranjan A. Talwalkar, C. Patrick Yue, and S. Simon Wong, "An Integrated 5.2 GHz CMOS T/R Switch with LC-tuned Substrate Bias," *International Solid-State Circuits Conference*, February 2003.

In FIG. 2 and FIG. 3 the source terminal 46 of MOS transistor 12 can be connected to ground. This circuit can be used as a switch, e.g., to select capacitors in and out of operation. Such an arrangement allows a low parasitic off-state capacitance from drain terminal 48 to ground while maintaining a low on-resistance. Since substrate terminal 36 is connected to a very high-impedance due to inductor 34, or LC-tank 58, at the frequencies of operation, the RF current from the drain, in the off-state, flows through the two back-to-back diodes formed by the drain-substrate and source-substrate diodes to the grounded source 16. This reduces the parasitic capacitance at the drain and greatly reduces substrate loss because there is little RF current flowing in the substrate at the frequencies of operation.

In any of the above embodiments, the reactive elements used in the frequency-selective circuit, whether they are inductive elements or capacitive elements, can be integrated on-chip or positioned off-chip. The inductive element can, in some cases, be a bond wire. The apparatus of the invention can be used in MOS transistors in standard CMOS circuits.

It is understood that the examples and embodiments described herein are for illustrative purposes only and that various modifications or changes in light thereof will be suggested to persons skilled in the art and are to be included within the spirit and purview of this application. All publications, patent applications cited herein are hereby incorporated by reference for all purposes in their entirety.

In view of the above, it will be clear to one skilled in the art that the above embodiments may be altered in many ways without departing from the scope of the invention. Accordingly, the scope of the invention should be determined by the following claims and their legal equivalents.

What is claimed is:

1. A method for adjusting an impedance of a substrate of a Metal-Oxide-Semiconductor transistor, said method comprising:
    a) providing a bias voltage fixed at a predetermined value;
    b) connecting a frequency-selective circuit between said substrate and said bias voltage;
    c) providing said frequency-selective circuit with at least one reactive element comprising at least one inductive element connected directly between said substrate and said bias voltage, to obtain a predetermined frequency-response of said frequency-selective circuit, thereby adjusting said impedance.

2. The method of claim 1, further comprising applying analog signals to said Metal-Oxide-Semiconductor transistor.

3. The method of claim 1, further comprising applying high-frequency signals to said Metal-Oxide- Semiconductor transistor.

4. The method of claim 1, wherein said at least one reactive element further comprises at least one capacitive element.

5. The method of claim 1, further comprising integrating at least one of said at least one reactive element on-chip.

6. The method of claim 1, further comprising positioning at least one of said at least one reactive element off-chip.

7. The method of claim 1, wherein at least one of said inductive elements is a bond wire.

8. The method of claim 4, wherein said at least one reactive element comprises one inductive element and one capacitive element configured to form an LC-tank having a resonant frequency in an operating range of said Metal-Oxide-Semiconductor transistor.

9. The method of claim 1, wherein said bias voltage is a ground voltage.

10. The method of claim 1, further comprising biasing a gate of said Metal-Oxide-Semiconductor transistor.

11. An apparatus for adjusting an impedance of a substrate of a Metal-Oxide-Semiconductor transistor, said apparatus comprising:
   a) a fixed bias voltage source;
   b) a frequency-selective circuit connected between said substrate and said fixed bias voltage source;
   c) at least one reactive element in said frequency-selective circuit, said at least one reactive element comprising at least one inductive element connected directly between said substrate and said fixed bias voltage for defining a predetermined frequency-response of said frequency-selective circuit, thereby adjusting said impedance.

12. The apparatus of claim 11, wherein said Metal-Oxide-Semiconductor transistor is integrated in a CMOS circuit.

13. The apparatus of claim 11, wherein said at least one reactive element further comprises at least one capacitive element.

14. The apparatus of claim 11, wherein at least one of said at least one reactive element is integrated on-chip.

15. The apparatus of claim 11, wherein at least one of said at least one reactive element is positioned off-chip.

16. The apparatus of claim 11, wherein at least one of said inductive elements is a bond wire.

17. The apparatus of claim 13, wherein said at least one reactive element comprises one inductive element and one capacitive element forming an LC-tank having a resonant frequency in an operating range of said Metal-Oxide-Semiconductor transistor.

18. The apparatus of claim 11, wherein said fixed bias voltage source is a ground voltage.

19. The apparatus of claim 11, further comprising a biasing circuit connected to a gate of said Metal-Oxide-Semiconductor transistor.

* * * * *